United States Patent [19]

Mitsuoka et al.

[11] 3,980,133

[45] Sept. 14, 1976

[54] HEAT TRANSFERRING APPARATUS UTILIZING PHASE TRANSITION

[75] Inventors: Hiroshi Mitsuoka; Yoshio Kimura, both of Amagasaki, Japan

[73] Assignee: Mitsubishi Denki Kabushiki Kaisha, Tokyo, Japan

[22] Filed: July 11, 1974

[21] Appl. No.: 487,650

[30] Foreign Application Priority Data

July 11, 1973 Japan.............................. 48-78191

[52] U.S. Cl.............................. 165/105; 174/15 R; 357/82
[51] Int. Cl.² .................... F28D 15/00; H01L 23/44
[58] Field of Search...................... 165/105; 357/82; 174/15 HP, 15 R; 317/100

[56] References Cited
UNITED STATES PATENTS

| | | | |
|---|---|---|---|
| 3,620,298 | 11/1971 | Somerville .......................... | 165/105 |
| 3,661,202 | 5/1972 | Moore, Jr. .......................... | 165/105 |
| 3,734,173 | 5/1973 | Moritz ................................ | 165/105 |

*Primary Examiner*—Albert W. Davis, Jr.
*Attorney, Agent, or Firm*—Oblon, Fisher, Spivak, McClelland & Maier

[57] ABSTRACT

A heat transferring apparatus comprising an evaporator and a condensor disposed thereabove, a conduit connecting the evaporator and condensor, and a plurality of fine fabric tubes made of glass fiber or the like disposed in the conduit, the tube walls being permeable to the coolant liquid phase of a coolant being used for cooling an electric or heat generating device in the evaporator, wherein a coolant gas vaporized by the latent heat of gasification in the evaporator is fed to the condensor through the conduit by the increasing pressure caused by the gasification and the coolant gas is then condensed by discharging the latent heat in the condensor, the condensed coolant liquid flowing down into the evaporator under force of gravity and this cycle is repeated to cool the electric or heat generating device. The feedback of the condensed coolant liquid is smoothly performed because of the permeable fabric tube in the conduit allowing the liquid coolant supported above the upflowing gas to permeate thereinto whereby frictional contact between the liquid and gas coolant phases is precluded and the liquid coolant is able to be returned freely through the fabric tubes to the evaporator.

4 Claims, 3 Drawing Figures

HEAT TRANSFERRING APPARATUS UTILIZING PHASE TRANSITION

BACKGROUND OF THE INVENTION

In apparatus of the type in which a condensor is disposed above the evaporator and connected by a conduit to a sealed condensable coolant, a coolant gas vaporized by the latent heat of gasification in the evaporator is fed upward to the condensor by the increasing pressure caused by the gasification and the coolant gas is then condensed by discharging the latent heat, and the condensed coolant liquid is caused to flow downward into the evaporator under the force of gravity as a mode of circulation of the coolant.

Accordingly, it is unnecessary in such apparatus to provide a circulation pump, whereby the apparatus can be of simple construction and a large quantity of heat can be effectively transmitted with a small difference of temperature as the phase transition of coolant is utilized. An important element can thus be electrically insulated by using an electrically insulative coolant. Thus, large quantities of power can be treated by a small portion, advantageously. Accordingly, such arrangements are especially suitable for cooling large capacity semiconductor devices which require high efficiency of transmission of heat and radiation of heat out of the apparatus.

FIG. 1 shows an example of the conventional apparatus which is applied as a heat transferring apparatus utilizing such phase transition of a coolant for cooling a semiconductor device. In this embodiment, the reference numeral 1 designates a stack having the structure of a heat generator, such as a semiconductor device equipped with a radiator, which is disposed within an evaporator 2 being sealed by a coolant liquid 3 at a level therein above the stack 1. A condensor 4 is placed above the evaporator 2, being connected by a conduit 5 to the evaporator. Radiation fins 6 for effectively radiating heat out of the apparatus are connected to the exterior regions of the condensor 4. A sealed terminal 7 is provided for electrically connecting the stack 1 to a suitable power source.

Thus, in the conventional apparatus disclosed, the coolant gas is vaporized by absorbing heat generated from the stack 1 in the evaporator 2 and is fed through the conduit 5 upward to the condensor 4, as shown by the dotted arrow line 8, by increasing pressure caused by the gasification in the evaporator, and the heat is discharged by the coolant gas contacting the wall of the condensor so as to be consensed to a liquid phase. On the other hand, the condensed coolant liquid is then returned by flowing down along the wall of the conduit 5 to the evaporator as shown by the full arrow line 9, so that it may be used again for cooling the stack 1. The vaporization and condensation steps are repeated by maintaining the thermal transferring function by the phase transition.

However, the natural circulation of the coolant can be smoothly performed only when the quantity of heat is relatively small. The natural circulation cannot be smoothly performed when the quantity of heat being transferred is increased. Thus, the coolant gas and the coolant liquid are counter-currently passing through the conduit 5, as shown by the arrow lines 8 and 9. Accordingly, the coolant liquid is essentially being pushed back to the condensor side by a friction contact occurring between the down flowing coolant liquid and the upflowing coolant gas. Moreover, the coolant liquid becomes clogged in the conduit 5 so as to disturb the upward passage of the coolant gas, wherein a partial heat-exchange takes place in the conduit, so as to prevent the best flow down of the coolant liquid, and thus, to defeat the primary function of the heat transferring apparatus.

The trouble is readily caused even when transferring smaller quantities of heat, depending upon the length of the conduits or curves, a step or a dead end of the conduit. In order to overcome such trouble, the condensor is disposed as close as possible to the evaporator and they are connected in vertical relation with a thick conduit or the coolant liquid is returned back through a different conduit so as to be completely separated from the coolant gas. However, such application or construction is limited and the apparatus becomes disadvantageously complicated and expensive.

As stated above, the heat transferring apparatus utilizing natural circulation and the phase transition of a coolant has various advantages, however, such troubles as discussed have prevented really practical application thereof.

SUMMARY OF THE INVENTION

An object of the present invention therefor is to provide an improved heat transferring apparatus of the character described wherein frictional contact between the coolant liquid in its downward passage and the coolant gas in its upward passage is precluded.

Another object of the present invention is to provide an improved heat transferring apparatus of the character described wherein the cooling efficiency of the apparatus is increased by eliminating some of the heat exchange previously encountered in prior art devices in the conduit connecting the evaporator and the condensor.

The present invention accomplishes the foregoing and other objects as well, in overcoming the disadvantages of the prior art apparatus, by inserting a plurality of fine tube of semi-permeable construction, or having a coolant liquid permeable wall, into the conduit connected between the evaporator and the condensor disposed thereabove, whereby the condensed coolant liquid passing downward in the conduit is separated from the vaporized coolant gas passing upward therein and the coolant liquid is thus returned through the fine tubes as will be described to the evaporator by the pressure head existing between the condensor and the evaporator.

BRIEF DESCRIPTION OF THE DRAWINGS

Various other objects, features and attendant advantages of the present invention will be more fully appreciated as the same becomes better understood from the following detailed description when considered in connection with the accompanying drawings, wherein like reference numerals designate like or corresponding parts throughout the several figures, and in which.

DESCRIPTION OF THE PREFERRED EMBODIMENTS

Figure 1:
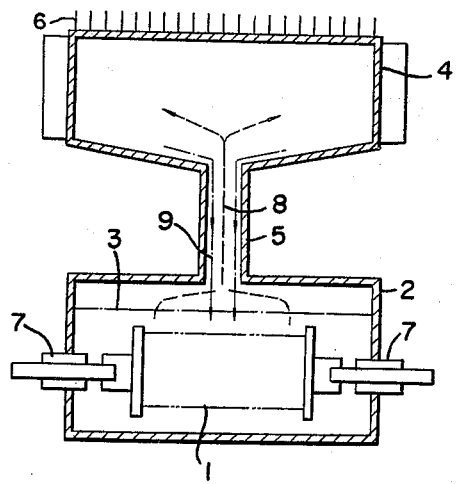
FIG. 1 is a sectional view of an example of conventional apparatus heretofore described.
Figure 2:
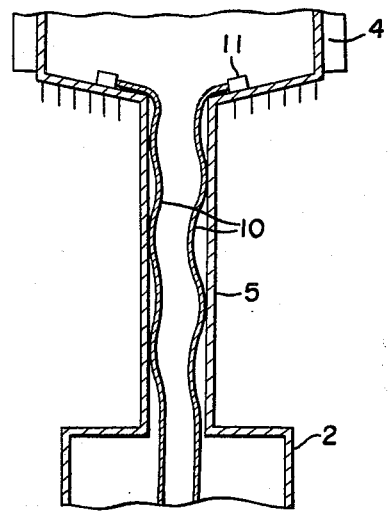
FIG. 2 is a sectional view of a part of one embodiment of the apparatus according to the present invention.

Referring again to the drawings, and more particularly to FIG. 2, vertically oriented fine tubes 10 composed of a semi-permeable wall, or one permeable by the coolant liquid, are inserted in the conduit 5 connecting the evaporator 2 to the condensor 4 disposed thereabove and fixers 11 are provided for fixing or securing the fine tubes to the interior of the evaporator in a manner to permit flow therearound through the conduit 5 between the condensor and evaporator.

Figure 3:
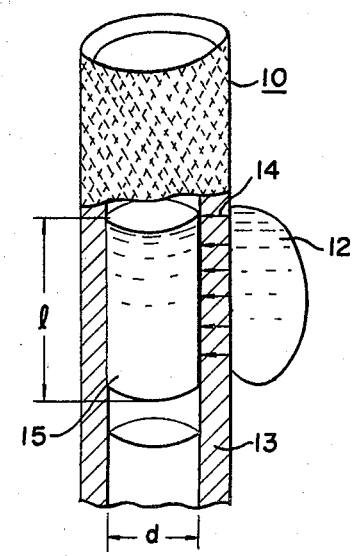
FIG. 3 is a partial sectional view of the fine tube of the present invention illustrating the operating of the apparatus of FIG. 2.

The operation of the apparatus of the present invention will be described in greater detail, reference being made further to FIG. 3. A coolant liquid 12 having been condensed in the condensor 4 and now moving downwardly under the force of gravity through the conduit 5, contacts the outer wall 13 of each of the fine tubes 10 in the conduit 5 or the condensor 4, and is absorbed into the fine tubes as shown by the arrow lines 14 by the capillarity of the walls of the fine tubes. When the inner diameter d of the fine tubes 10 is less than a constant determined by the surface tension of the coolant liquid, the liquid phase is absorbed into the wall of the fine tubes to form a coolant liquid path 15 in the fine tubes because of the surface tension as permeating to the inner part of the fine tubes. On the other hand, the walls of the fine tubes absorbing the coolant liquid performs as a suitable sealing membrane to the coolant gas to prevent permeation of the coolant gas into the fine tubes. As the result, the coolant liquid 15 is not pushed back by the coolant gas rising in the conduit 5, but smoothly flows down through the fine tubes, to return to the evaporator 2.

When the quantity of heat being transferred is increased and the quantity of the cooling liquid is increased, the length $l$ of the coolant liquid column formed in the fine tubes 10 is increased and the gravity force of the coolant liquid column is also increased so as to increase the flowing velocity of the coolant liquid, advantageously. The quantity of the coolant liquid transferred by one fine tube is limited to the condition of filling the fine tube completely with coolant liquid. A plurality of fine tubes can be inserted, however, depending upon the desirable total quantity of the coolant liquid to be transferred.

Each of the fine tubes 10 can be a glass filament winding tube which is knitted with glass fibers. However, other similar structural compositions may be employed.

As stated above, in accordance with the present invention, the coolant liquid is easily separated from the coolant gas during their passages through the conduit 5 so as to return smoothly to the evaporator side only by inserting a plurality of fine tubes having coolant liquid permeable walls in the conduit between the condensor and the evaporator. Accordingly, needless friction of the coolant liquid and the coolant gas in the conduit is precluded and the disadvantages of the conventional apparatus caused by such friction can be completely dissolved.

In the embodiment illustrated herein, the cooling of a semiconductor is illustrated. However, the invention can be applied for cooling not only a semiconductor, but also any heat transferring apparatus utilizing phase transition wherein a condensor is placed above an evaporator. As should be understood from the above illustration, the walls of the fine tubes 10 can comprise a coolant liquid permeable wall in one part and an inpermeable wall in another part, if desired. Also, in the illustrated embodiment, while each of the fine tubes 10 having a coolant liquid permeable wall is used for returning the liquid coolant to the evaporator, it is also possible to use a string or a wick member made of a coolant permeable composite instead of the fine tubes, through which the coolant liquid may be downwardly transferred upon absorption thereby, while the coolant gas moves upwardly therearound.

Obviously, therefore, many modifications and variations of the present invention are possible in light of the above teachings. It is to be understood therefore, that within the scope of the appended claims, the invention may be practiced otherwise than as specifically described herein.

What is claimed as new and desired to be secured by Letters Patent of the United States is:

1. A heat transferring apparatus utilizing phase transition which comprises:

an evaporator for housing a heat generating device and containing a condensable coolant;

a condensor disposed above said evaporator;

a conduit, the sectional area of which is less than that of said evaporator and condensor, connecting between a part of the bottom of said condensor and a part of the top of said evaporator, said bottom of said condensor sloping downwardly toward the interconnection of said condensor and said evaporator so as to facilitate the flow of the condensate toward said conduit; and a plurality of tubular elements composed of a material permeable by said coolant in its liquid phase and non-permeable by said coolant in its gaseous phase, inserted in said conduit and secured within said condensor for transferring the condensed coolant liquid from said condensor to said evaporator, said elements being longitudinally aligned with said conduit yet of a non-linear configuration such that external peripheral portions of said elements are in contact with the internal periphery of said conduit while other external peripheral portions of said elements are spaced from said internal periphery of said conduit so as to define chambers therewith, said coolant gas being conducted from said evaporator to said condensor through said chambers and said conduit while said coolant liquid is conducted from said condensor to said evaporator through said conduit, said portions of said elements in contact with said conduit, and the interior portions of said tubular elements, whereby interference between said coolant gas flow and said coolant liquid flow is precluded.

2. The heat transferring apparatus according to claim 1, wherein said elements for transferring said consensed coolant liquid from said condensor to said evaporator comprise fine tubes.

3. The heat transferring apparatus according to claim 2, wherein said fine tubes are composed of a knitted glass fiber.

4. The heat transferring apparatus according to claim 1, wherein said elements for transferring said condensed coolant liquid from said condensor to said evaporator comprise wick members.

* * * * *